(12) United States Patent
Getta et al.

(10) Patent No.: US 8,648,662 B2
(45) Date of Patent: Feb. 11, 2014

(54) OSCILLATOR CIRCUIT WITH A FAST TRANSIENT

(75) Inventors: Klaus Getta, Bochum (DE); Giuseppe Li Puma, Bochum (DE)

(73) Assignee: Intel Mobile Communications GmbH, Neubiberg (DE)

( * ) Notice: Subject to any disclaimer, the term of this patent is extended or adjusted under 35 U.S.C. 154(b) by 68 days.

(21) Appl. No.: 12/716,379

(22) Filed: Mar. 3, 2010

(65) Prior Publication Data

US 2011/0090016 A1 Apr. 21, 2011

(30) Foreign Application Priority Data

Mar. 5, 2009 (DE) .......................... 10 2009 011 840

(51) Int. Cl.
*H03B 5/32* (2006.01)
(52) U.S. Cl.
USPC .......................... 331/158; 331/182; 331/183
(58) Field of Classification Search
USPC ....................... 331/158, 182, 183, 107 R, 154
See application file for complete search history.

(56) References Cited

U.S. PATENT DOCUMENTS

| | | | | |
|---|---|---|---|---|
| 4,117,421 A | * | 9/1978 | Wiesner | 331/116 FE |
| 4,704,587 A | * | 11/1987 | Ouyang et al. | 331/116 FE |
| 4,956,618 A | | 9/1990 | Ulmer | |
| 5,528,201 A | * | 6/1996 | Davis | 331/116 FE |
| 6,133,801 A | | 10/2000 | Tanaka | |
| 7,109,813 B2 | | 9/2006 | Pan | |
| 7,554,414 B2 | * | 6/2009 | Christ | 331/55 |

FOREIGN PATENT DOCUMENTS

DE 102005001684 A1 7/2007

* cited by examiner

*Primary Examiner* — Joseph Chang
*Assistant Examiner* — Jeffrey Shin
(74) *Attorney, Agent, or Firm* — SpryIP, LLC

(57) ABSTRACT

An oscillator circuit for producing a frequency signal has a resonator element, an amplifier circuit and a coupling apparatus. The coupling apparatus connects the amplifier circuit to the resonator element for the duration of a switching-on process in the oscillator circuit.

15 Claims, 3 Drawing Sheets

OSCILLATOR CIRCUIT WITH A FAST TRANSIENT

RELATED APPLICATIONS

This Application claims benefit of German Patent Application No. 102009011840.3, which was filed on Mar. 5, 2009. The entire contents of Application No. 102009011840.3 are hereby incorporated herein by reference.

BACKGROUND

An oscillator circuit is an electronic circuit for providing an oscillating output signal (frequency signal), such as a clock signal. In order to provide a reference frequency signal, crystal oscillators are used, which use a quartz crystal to provide a reliable frequency signal. Such a reference frequency signal is often used in electronic systems as a standard clock signal which is taken as a basis for producing other frequency signals, for example using a phase locked loop.

Particularly in mobile systems, such as in mobile radio systems, the switching-on time of the oscillator circuit is an important parameter. This becomes clear from the GSM mobile radio system. The GSM mobile radio system uses a time slot method (time divisional multiple access or TDMA) for transmission. In the TDMA transmission scheme, the mobile terminal is alternately operated in an active state and in a quiescent state. In the active state, the terminal is in a transmission or reception state, so that transmission takes place via the communication channel. In this case, the mobile terminal performs signal processing. The signal processing requires a reference clock frequency of 26 MHz, as stipulated by the standard. In the quiescent state between two active states, it is merely necessary to accurately monitor the period of time, so that the mobile terminal can revert to an active state at the right time. According to the stipulations of the standard, the mobile clock signal must operate at a clock frequency of 32 kHz.

To this end, the mobile terminal usually has a relatively simple 32 kHz oscillator circuit and a more accurate 26 MHz oscillator circuit. The 26 MHz oscillator circuit is switched on before a corresponding active state starts, that is to say prior to an actual transmission or reception state. Usually, the switching-on process is between 5 and 10 ms. The longer the switching-on process lasts, the more power required by the 26 MHz oscillator circuit. The frequent changing between active states and quiescent states in the 26 MHz oscillator circuit allows the power consumption of the 26 MHz oscillator circuit and hence of the mobile terminal to be reduced as a result of a reduction in the switching-on time. Overall, a reduced power consumption allows the power reserve of the mobile terminal to be reduced and hence the operating time of the mobile terminal to be extended.

SUMMARY

In this case, an oscillator circuit for producing a frequency signal has a resonator element, an amplifier circuit and a coupling apparatus. The coupling apparatus is in a form such that it connects the amplifier circuit to the resonator element for the duration of a switching-on process in the oscillator circuit.

One embodiment herein is to provide an oscillator circuit in which the resonance element, for example the quartz crystal, is connected to an amplifier circuit while the oscillator circuit is in the switching-on process. The energy additionally injected into the oscillator circuit allows the latter to settle more quickly.

In one refinement, the coupling apparatus is in a form such that it decouples the amplifier circuit from the resonator element outside of the switching-on process. This couples the noise caused by the amplifier circuit out of the oscillator circuit after the switching-on process. By way of example, it is thus possible to provide an oscillator circuit for a mobile terminal which allows a fast switching-on process and, after the transient, a low noise spectrum in the oscillator circuit.

In one refinement, the resonator element has a crystal oscillator, such as a quartz crystal.

In one refinement, the amplifier apparatus is connected in parallel with the resonator element. The amplifier apparatus may have a series circuit of inverter elements.

In one refinement, the oscillator circuit is in the form of a Colpitts oscillator.

BRIEF DESCRIPTION OF THE DRAWINGS

Embodiments of are explained in more detail below using a plurality of exemplary embodiments with reference to the drawings.

DETAILED DESCRIPTION

Figure 1:
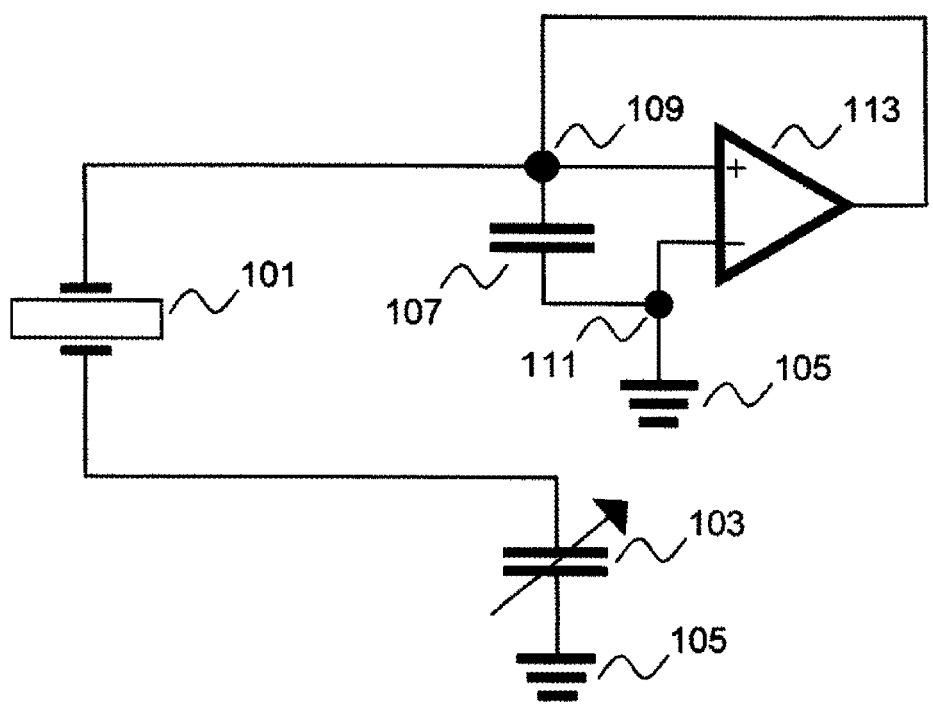
FIG. 1 shows a schematic illustration of a crystal oscillator circuit.

FIG. 1 shows a schematic illustration of a crystal oscillator circuit. The crystal oscillator circuit has a resonator element 101, which may be a crystal or a quartz crystal, for example. The resonator element 101 is connected to a ground potential 105 via a variable capacitance 103. It is also connected to the ground potential 105 via an output capacitance 107. The output capacitance 107 has a first output contact 109 and a second output contact 111 on it, said output contacts being used to provide the frequency signal produced by the oscillator circuit.

The first output contact 109 and the second output contact 111 are connected to the inputs of a differential amplifier 113. An output of the differential amplifier 113 is connected to the first output contact 109, so that a portion of the frequency signal is returned to the oscillator circuit.

The crystal oscillator shown corresponds to a Colpitts oscillator. The capacitance network formed from the variable capacitance 103 and the output capacitance 107 is used to stimulate the resonator element 101 to oscillate. The frequency signal produced in this manner is fed back into the oscillator circuit by the differential amplifier 113. The differential amplifier 113 is also used to inject power into the oscillator circuit. The supply of power to the oscillator circuit is therefore effected in the resonance spectrum of the oscillator circuit. This speeds up the transient.

The resonator element 101 may be in the form of a quartz crystal. A quartz crystal typically has a resonance frequency at a frequency of 32.768 kHz. The oscillator circuit will accordingly be designed for a resonance frequency of approximately 32 kHz.

Figure 2:
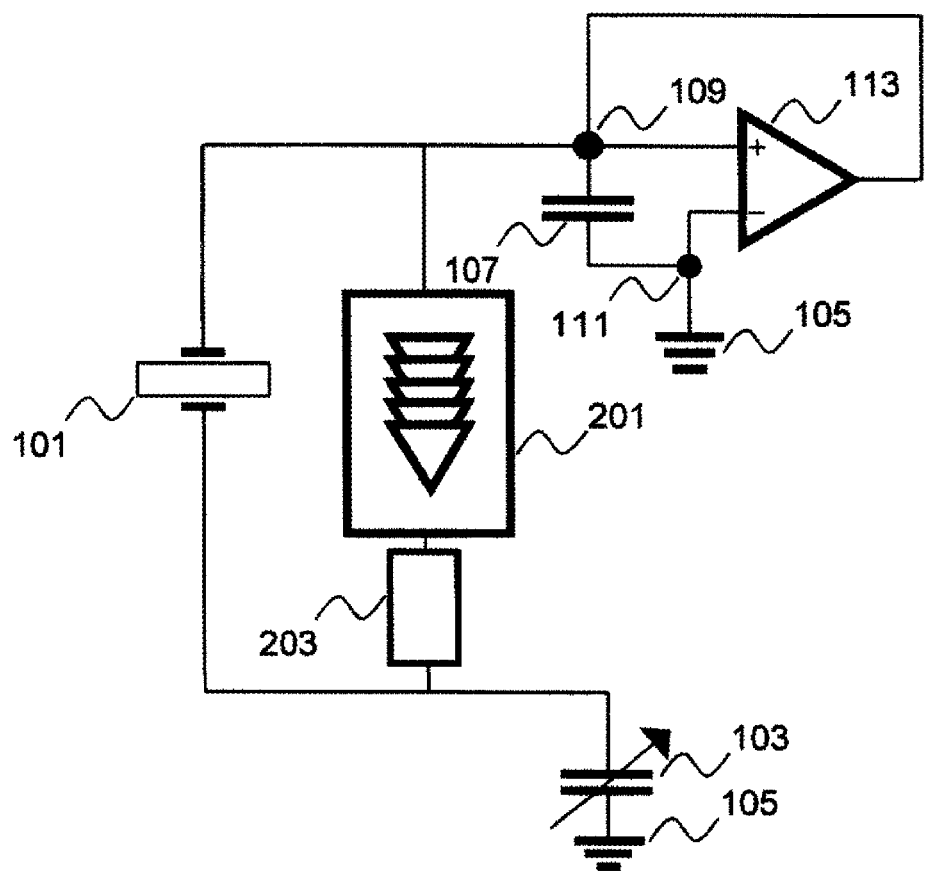
FIG. 2 shows a schematic illustration of an oscillator circuit according to the invention.

FIG. 2 is a schematic illustration of an oscillator circuit according to the invention. In this case, the oscillator circuit exhibits a Colpitts oscillator, as shown in FIG. 1. Where the same elements as in the oscillator circuit in FIG. 1 are shown, the same reference symbols are used.

The oscillator circuit shown in FIG. 2 differs from the Colpitts oscillator in FIG. 1 by virtue of an amplifier circuit 201 and a coupling apparatus 203 which are connected in series. The amplifier circuit 201 and the coupling apparatus 203 are connected in parallel with the resonator element 101. In this case, the coupling apparatus 203 is set up such that it connects the amplifier circuit 201 to the resonator element 101 for the duration of a switching-on process in the oscillator circuit. Outside of the switching-on process, the amplifier circuit 201 is decoupled from the resonator element 101 by the coupling apparatus 203.

Hence, during a switching-on process, the oscillator circuit is additionally supplied with power by the amplifier circuit 201. In this case, the amplifier circuit 201 amplifies the signal applied to (and coming from) the resonator element 101. The supply of power means that the resonator element 101 locks onto its resonant frequency more quickly. This reduces the switching-on time. When the resonator element 101 has settled, amplification of the signal is disadvantageous, since the amplifier circuit 201 can cause undesirable noise. Accordingly, the amplifier circuit 201 is decoupled from the resonator element 101 and hence from all of the rest of the oscillator circuit by the coupling apparatus 203. The amplifier circuit 201 therefore no longer influences the manner of operation of the oscillator circuit when the switching-on process has ended.

Figure 3:
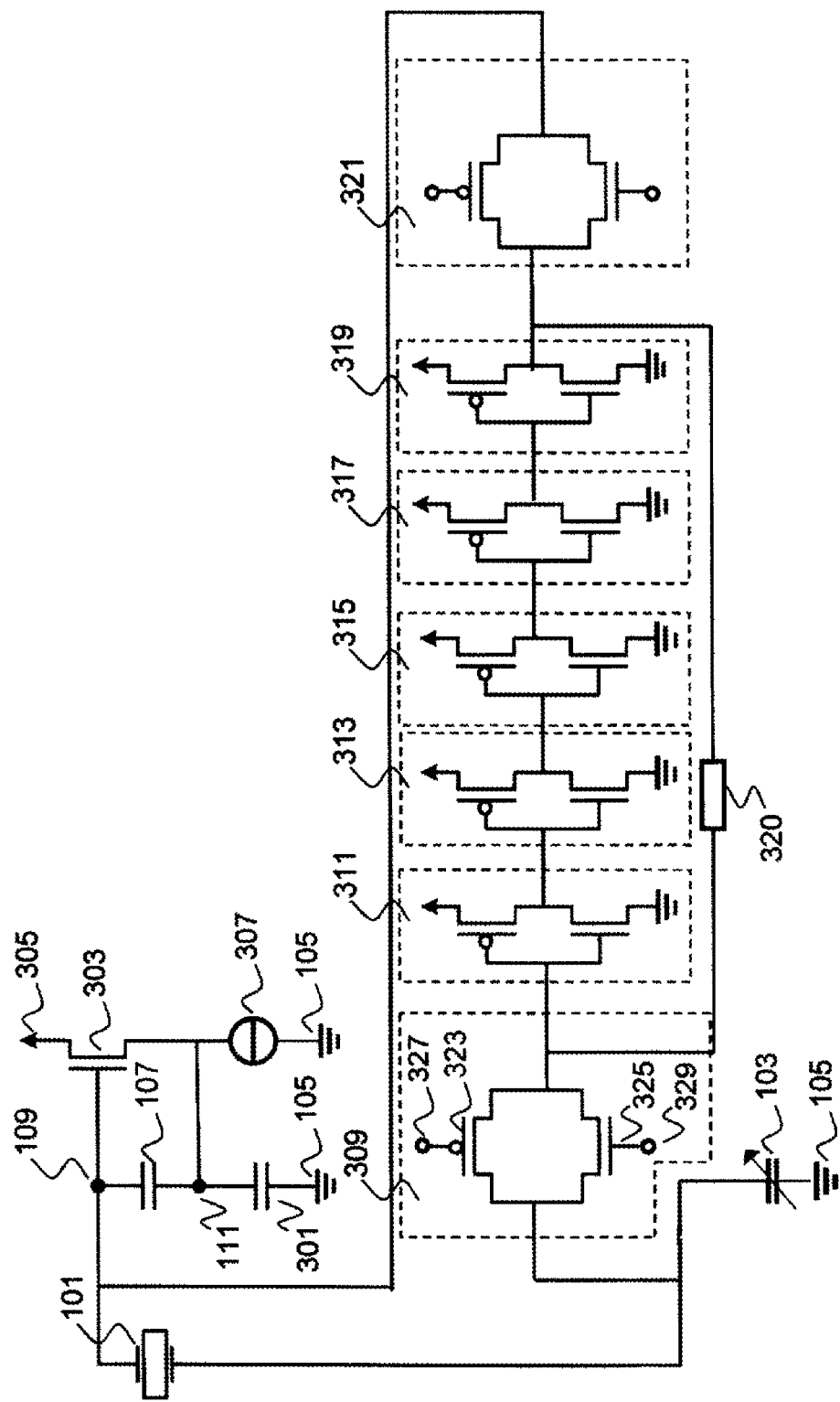
FIG. 3 shows a schematic illustration of an oscillator circuit according to an embodiment of the invention.

FIG. 3 is a schematic illustration of an oscillator circuit according to an embodiment of the invention.

In this case, the oscillator circuit likewise exhibits a Colpitts oscillator, as shown in FIG. 1. Where the same elements as in the oscillator circuit in FIG. 1 are shown, the same reference symbols are used.

As in the oscillator circuits illustrated above, the resonator element 101 is connected to a ground potential 105 via a variable capacitance 103. It is also connected to the ground potential 105 via an output capacitance 107 and a buffer capacitance 301. Between the resonator element 101 and the output capacitance 107 there is the first output contact 109, and between the output capacitance 107 and the buffer capacitance 301 there is the second output contact 111. The first output contact 109 and the second output contact 111 are used to provide the frequency signal produced by the oscillator circuit.

The first output contact 109 is connected to the gate connection of an amplification transistor 303. A drain connection of the amplification transistor 303 is connected to a supply voltage connection 305. A source connection of the amplification transistor 303 is connected to a current source 307. The current source 307 may be in the form of a current mirror. The amplification transistor 303 and the current source 307 together form the differential amplifier 113 of a Colpitts oscillator.

Connected in parallel with the resonator element 101 is a series circuit which comprises a series circuit containing a first transductance element 309, a first inverter 311, a second inverter 313, a third inverter 315, a fourth inverter 317, a fifth inverter 319 and a second transductance element 321. The inverters 311, 313, 315, 317, 319 form an inverter line. Connected in parallel with the inverter line is a resistor 320. So that the inverter line forms an amplifier circuit which contains an amplified form of the input signal and no phase shift, an uneven number of inverters is provided. In this case, the number may differ from the number of five inverters which is shown. The gain factor is determined by the design and by the number of inverters. The more inverters of the same type are provided, the higher the gain factor. Since the inverter line is coupled to the rest of the oscillator circuit only during the switching-on process, phase noise resulting from the delay in the inverters is not detrimental to the quality of the outgoing frequency signal. In this respect, with a suitable delay in the inverter line, it is also conceivable to provide an even number of inverters. In addition, the inverter line consumes little current. As soon as the inverter line is decoupled from the rest of the oscillator circuit, a power consumption is caused only by quiescent currents in the inverter line.

The first transductance element 309 and the second transductance element 321 are of the same design. In terms of their operation, they correspond to the coupling circuit 203. Each transductance element 309, 321 has a respective PMOS transistor 323 and NMOS transistor 325. The source/drain path for the PMOS transistor 323 is connected in parallel with the source/drain path for the NMOS transistor 325. A gate connection of the PMOS transistor 323 is coupled to a first control connection 327. A gate connection of the NMOS transistor 325 is coupled to a second control connection 329. The first control connection 327 is used to provide a first signal, and the second control connection 329 is used to provide a second signal. The first signal and the second signal are chosen such that they assume a value which either enables or disables the source/drain path of the PMOS transistor 323 and of the NMOS transistor 325. In this case, the second signal can be produced by inverting the first signal. The first signal and the second signal are used to switch the first transductance element 309 and the second transductance element 321 to an on or off state. In an on state, the source/drain paths of the PMOS transistor 323 and the NMOS transistor 325 are enabled. In an off state, said source/drain paths are disabled. In an off state, the transductance elements 309, 321 decouple the inverter line from the rest of the oscillator circuit. In an on state, the inverter line is supplied with the frequency signal from the resonator element 101, and said frequency signal is amplified there. To achieve reliable operation of the oscillator, the transductance elements 309, 321 are put into the on state by means of the first and second signals during the switching-on process, so that the transient is shortened. When the switching-on process has ended, the transductance elements 309, 321 are put into an off state by means of the first signal and the second signal, as a result of which the amplifier circuit in the form of the inverter line is decoupled from the rest of the oscillator circuit and thus does not influence the operation of the oscillator circuit further.

The invention claimed is:

1. An oscillator circuit for producing a frequency signal, comprising:
   a resonator element;
   an amplifier circuit to supply power to the resonator element, the amplifier apparatus having a series circuit of inverter elements; and
   a coupling apparatus,
   wherein the coupling apparatus is in a form such that it connects the amplifier circuit to the resonator element for the duration of a switching-on process in the oscillator circuit.

2. The oscillator circuit as claimed in claim 1, wherein the coupling apparatus is in a form such that it decouples the amplifier circuit from the resonator element outside of the switching-on process.

3. The oscillator circuit as claimed claim 1, wherein the resonator element has a crystal oscillator.

4. The oscillator circuit as claimed claim 3, wherein the resonator element has a quartz crystal.

5. The oscillator circuit as claimed in claim 1, wherein the amplifier apparatus is connected in parallel with the resonator element.

6. The oscillator circuit as claimed in claim 1, wherein the amplifier circuit has an uneven number of inverters.

7. The oscillator circuit as claimed claim 1, wherein the oscillator circuit being in the form of a Colpitts oscillator.

8. The oscillator circuit as claimed in claim 1, wherein the coupling apparatus includes at least one transductance element.

9. The oscillator circuit as claimed in claim 1, wherein the coupling apparatus includes at least two elements, a first of the two elements preceding the amplifier circuit and a second of the two elements following the amplifier circuit.

10. The oscillator circuit as claimed in claim 9, wherein in the two elements are transductance elements.

11. The oscillator circuit as claimed in claim 1, wherein the coupling apparatus is to receive a first signal to enable the coupling apparatus to connect the amplifier circuit to the resonator element.

12. The oscillator circuit as claimed in claim 11, wherein the coupling apparatus is to receive a second signal to disable the coupling apparatus from connecting the amplifier circuit to the resonator element.

13. The oscillator circuit as claimed in claim 12, wherein the coupling apparatus includes a first input to receive the first signal and a second input to receive the second signal.

14. The oscillator circuit as claimed in claim 1, wherein the coupling apparatus is coupled in series with the amplifier circuit.

15. the oscillator circuit as claimed in claim 1, wherein the coupling apparatus is to couple the amplifier circuit to the resonator element for a complete duration of a switching-on process in the oscillator circuit.

* * * * *